US012662373B2

(12) United States Patent
Ide et al.

(10) Patent No.: US 12,662,373 B2
(45) Date of Patent: Jun. 23, 2026

(54) METHOD FOR MANUFACTURING MIRROR DEVICE

(71) Applicant: HAMAMATSU PHOTONICS K.K., Hamamatsu (JP)

(72) Inventors: Tomoyuki Ide, Hamamatsu (JP); Daiki Suzuki, Hamamatsu (JP); Mikito Takahashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 422 days.

(21) Appl. No.: 18/037,142

(22) PCT Filed: Sep. 15, 2021

(86) PCT No.: PCT/JP2021/033949

§ 371 (c)(1),
(2) Date: May 16, 2023

(87) PCT Pub. No.: WO2022/137674

PCT Pub. Date: Jun. 30, 2022

(65) Prior Publication Data

US 2024/0002219 A1      Jan. 4, 2024

(30) Foreign Application Priority Data

Dec. 21, 2020     (JP) ................................. 2020-211201

(51) Int. Cl.
B81C 1/00          (2006.01)
B81C 99/00         (2010.01)
G02B 26/08         (2006.01)
(52) U.S. Cl.
CPC ...... B81C 1/00666 (2013.01); B81C 1/00888 (2013.01); B81C 99/004 (2013.01); G02B 26/0833 (2013.01)

(58) Field of Classification Search
CPC .. B81C 2201/0167; B81C 2201/01694; B81C 2201/0169; B81C 1/00888;
(Continued)

(56) References Cited

U.S. PATENT DOCUMENTS 6,778,315 B2 *   8/2004  Guo ................... G02B 26/0866
                                            359/290
2002/0181110 A1 * 12/2002  Bower ................ B81C 1/00666
                                            359/838
(Continued)

FOREIGN PATENT DOCUMENTS

CN        110927960 A      3/2020
JP        2002-196267 A    7/2002
(Continued)

OTHER PUBLICATIONS

International Preliminary Report on Patentability mailed Jun. 29, 2023 for PCT/JP2021/033949.

*Primary Examiner* — Alia Sabur
(74) *Attorney, Agent, or Firm* — Faegre Drinker Biddle & Reath LLP

(57)          ABSTRACT

A method for manufacturing a mirror device is a method for manufacturing a mirror device including a structural body that includes a support portion, a movable portion, and a coupling portion, and a mirror layer provided on the movable portion. The method for manufacturing a mirror device includes: a first forming step of forming a plurality of parts on a wafer, each of the plurality of parts corresponding to the structural body; a second forming step of forming the mirror layer on a part of each of the plurality of parts, the part corresponding to the movable portion; a heating step of heating the part of each of the plurality of parts, corresponding to the movable portion, after the first forming step and the second forming step; and a cutting step of cutting the
(Continued)

wafer to separate the plurality of parts from one another, after the heating step.

15 Claims, 11 Drawing Sheets

(58) Field of Classification Search
CPC .......... B81C 1/00904; B81B 2201/042; G02B
26/0841; B23K 26/53
See application file for complete search history.

(56) References Cited

U.S. PATENT DOCUMENTS

| | | | |
|---|---|---|---|
| 2004/0057102 | A1 | 3/2004 | Guo et al. |
| 2009/0220777 | A1 | 9/2009 | Sporn |
| 2021/0309513 | A1 * | 10/2021 | Brockmeier ......... G02B 26/105 |

FOREIGN PATENT DOCUMENTS

| | | | |
|---|---|---|---|
| JP | 2010-044410 A | | 2/2010 |
| JP | 2010-256452 A | | 11/2010 |
| JP | 2011-180249 A | | 9/2011 |
| JP | 2014-059527 A | | 4/2014 |
| JP | 2014168819 A | * | 9/2014 |
| JP | 2018-010038 A | | 1/2018 |
| JP | 2018-072591 A | | 5/2018 |
| WO | 2009/107835 A1 | | 7/2011 |

* cited by examiner (a)

(b)

(a)

(b)

(a)

(b)

METHOD FOR MANUFACTURING MIRROR DEVICE

TECHNICAL FIELD

One aspect of the present disclosure relates to a method for manufacturing a mirror device having a movable portion.

BACKGROUND ART

Patent Literature 1 discloses a method for manufacturing a mirror device having a movable portion. In the manufacturing method disclosed in Patent Literature 1, a plurality of micromechanical structures having movable structural bodies are formed on a semiconductor substrate and then separated from one another by dicing. The movable structural bodies are curved at this point. Subsequently, a metal layer that functions as a mirror is formed on the movable structural bodies and the entire micromechanical structure is heated. The movable structural bodies are flattened by this heating process.

CITATION LIST

Patent Literature

Patent Literature 1: Japanese Unexamined Patent Publication No. 2014-168819

SUMMARY OF INVENTION

Technical Problem

The method for manufacturing a mirror device described above requires that the mirror device be manufactured more favorably. It is thus an object of one aspect of the present disclosure to provide a method for manufacturing a mirror device by which a mirror device having a movable portion can be favorably manufactured.

Solution to Problem

A method for manufacturing a mirror device according to one aspect of the present disclosure is a method for manufacturing a mirror device including a structural body that includes a support portion, a movable portion, and a coupling portion coupling the movable portion to the support portion such that the movable portion is swingable or movable, and a mirror layer provided on the movable portion, the method including: a first forming step of forming, on a wafer, a plurality of parts, each corresponding to the structural body; a second forming step of forming the mirror layer on a part of each of the plurality of parts, corresponding to the movable portion; a heating step of heating the part of each of the plurality of parts, corresponding to the movable portion, after the first forming step and the second forming step; and a cutting step of cutting the wafer to separate the plurality of parts from one another, after the heating step.

A residual stress may be generated in the mirror layer when forming the mirror layer, and the mirror layer may warp due to the residual stress. If the mirror device is shipped in this state, there is a concern that an amount of warp of the mirror layer may change due to the relief of the residual stress due to environmental temperature or self-heating during use. However, in this method for manufacturing a mirror device, the part of each of the plurality of parts, corresponding to the movable portion, is heated after the plurality of parts, each corresponding to the structural body, are formed on the wafer and after the mirror layer is formed on the part of each of the plurality of parts, corresponding to the movable portion. This enables the residual stress present in the mirror layer to be relieved and the change in the amount of warp of the mirror layer to be suppressed during use of the mirror device. Additionally, in the method for manufacturing a mirror device, the wafer is cut after heating. This enables uniformity of the temperature of the mirror layer among the plurality of parts to be achieved during heating compared to a case in which a heating process is performed after cutting the wafer. As a result, a variation in the quality of the mirror device can be suppressed. Heating in a wafer state enables many mirror devices to be disposed, for example, inside a thermostatic chamber used for heating. As a result, the manufacturing efficiency of the mirror device can be improved. Additionally, for example, in a case in which the amount of warp of the mirror layer is measured after heating, the amount of warp in the wafer state can be measured. In this case, the position of the mirror layer can be accurately determined, so that the measurement efficiency can be improved. Additionally, for example, in a case in which the mirror layer is cleaned after heating, cleaning can be performed in the wafer state, so that the work efficiency of cleaning can be improved. Additionally, in a case in which the heating process is performed after cutting the wafer, fragments of the wafer generated during cutting may adhere to the mirror layer, and there is a concern in such a case that the semiconductor material forming the fragments may diffuse into the mirror layer due to the fragments being heated in the heating process, and reduce the reflectivity of the mirror layer. However, this can be suppressed in the method for manufacturing a mirror device, since the wafer is cut after heating in the wafer state. As a result, the quality of the mirror device is ensured. As described above, the mirror device having a movable portion can be favorably manufactured by this method for manufacturing a mirror device.

The method for manufacturing a mirror device according to one aspect of the present disclosure may further include, between the heating step and the cutting step, a measuring step of measuring the amount of warp of the mirror layer. In this case, the amount of warp of the mirror layer can be measured in the wafer state, and the measurement efficiency can be improved.

In the cutting step, the wafer may be cut by forming a modified region inside the wafer by irradiation of laser light, and extending cracks in a thickness direction of the wafer from the modified region. In this case, a stress acting on the wafer during cutting can be reduced, and deformation of the mirror layer and the movable portion due to the stress can be suppressed. The change in the amount of warp of the mirror layer during cutting can also be suppressed.

The second forming step may be performed after the first forming step. In this case, reduction in the quality of the mirror layer due to the heat when forming the plurality of parts can be suppressed.

In the heating step, the amount of warp of the mirror layer may be reduced by heating the part of each of the plurality of parts, corresponding to the movable portion. Alternatively, the amount of warp of the mirror layer may be increased by heating the part of each of the plurality of parts, corresponding to the movable portion. In either case, the residual stress present in the mirror layer can be relieved, and the change in the amount of warp of the mirror layer can be suppressed during use of the mirror device.

The mirror layer may be formed by sputtering in the second forming step. In this case, the mirror layer can be favorably formed.

The mirror device may further include a coil or a piezoelectric element configured to exert a driving force on the movable portion. Although heat tends to be generated during use of the mirror device in this case, in the method for manufacturing a mirror device, the change in the amount of warp of the mirror layer can be suppressed during use of the mirror device even in this case.

In the heating step, the part of each of the plurality of parts, corresponding to the movable portion, may be heated to 60° C. or higher and 300° C. or lower. In this case, the residual stress present in the mirror layer can be effectively relieved.

A maximum width of the mirror layer may be 0.5 mm or more and 30 mm or less. Although the amount of warp of the mirror device tends to change during use of the mirror device in this case, in the method for manufacturing a mirror device, the change in the amount of warp of the mirror layer can be suppressed during use of the mirror device even in this case.

The mirror layer may include an adhesive layer, a diffusion prevention layer, and a reflective layer formed in this order on the movable portion. In this case, including the adhesive layer enables the mirror layer to be stably formed on the movable portion. Additionally, including the diffusion prevention layer suppresses the occurrence of metal diffusion between the reflective layer and the adhesive layer during heating.

The mirror layer may include a plurality of layers including a reflective layer, and the plurality of layers may include a layer in which a compressive stress remains at the completion of the second forming step, and a layer in which a tensile stress remains at the completion of the second forming step. In this case, the amount of warp of the mirror layer prior to the heating step can be reduced. The change in the amount of warp of the mirror layer in the heating step can also be reduced, and as a result, heating time can be shortened and the amount of warp of the mirror layer can be easily controlled.

The entire wafer may be heated in the heating step. In this case, uniformity of the temperature of the mirror layer among the plurality of parts can be achieved during heating.

In the heating step, the part of each of the plurality of parts, corresponding to the movable portion, may be heated without heating the entire wafer. In this case as well, uniformity of the temperature of the mirror layer among the plurality of parts can be achieved by heat being conducted in the wafer, even if there is a variation in the position or output of a heat source used in the heating step.

Advantageous Effects of Invention

One aspect of the present disclosure is capable of providing a method for manufacturing a mirror device by which a mirror device having a movable portion can be favorably manufactured.

DESCRIPTION OF EMBODIMENTS

An embodiment of the present disclosure will be described in detail below with reference to the drawings. In the description below, same reference signs are given to the same or corresponding elements, and redundant explanation is omitted.

[Mirror Device]

Figure 1:
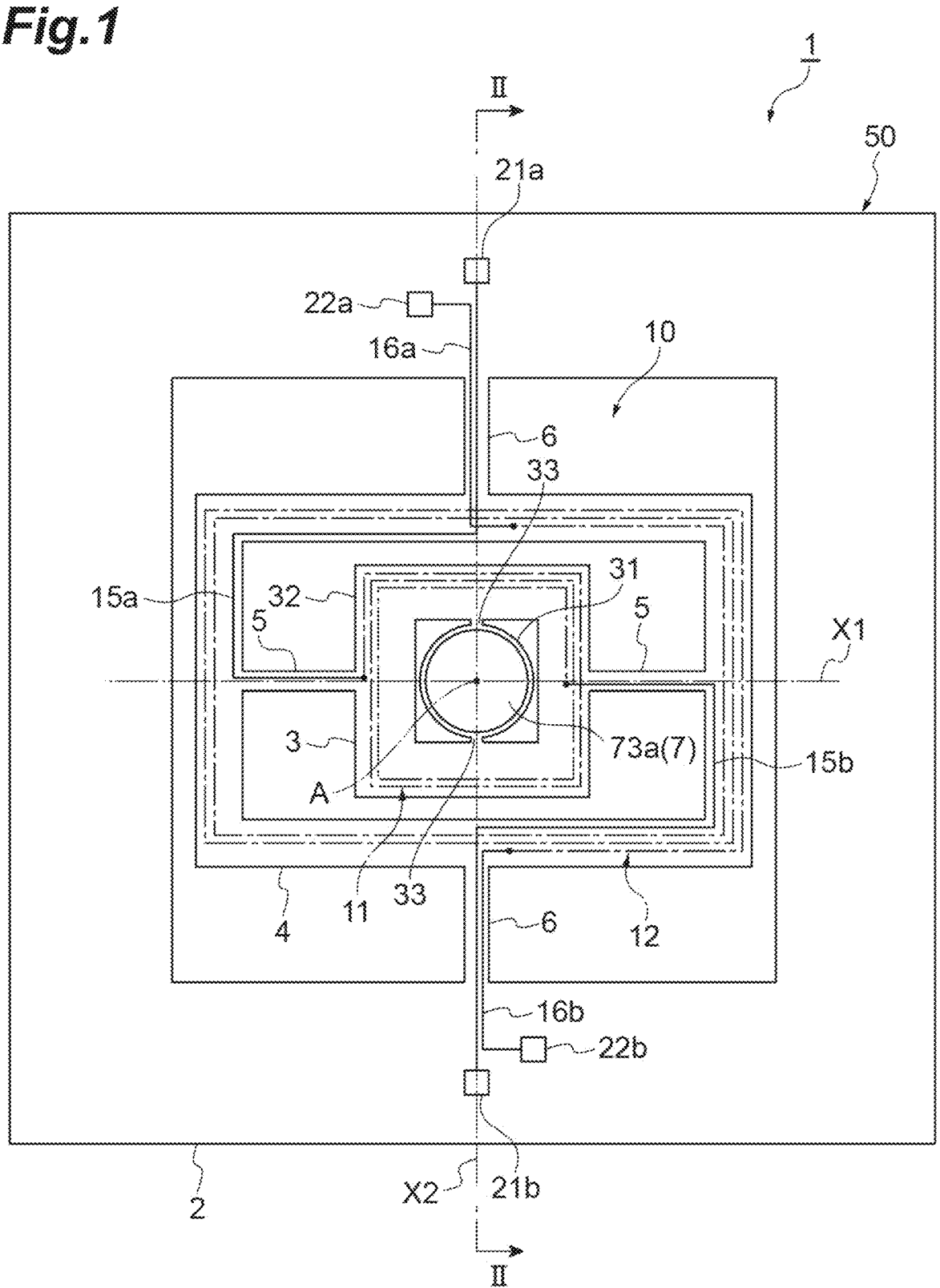
FIG. 1 A plan view of a mirror device.
Figure 2:
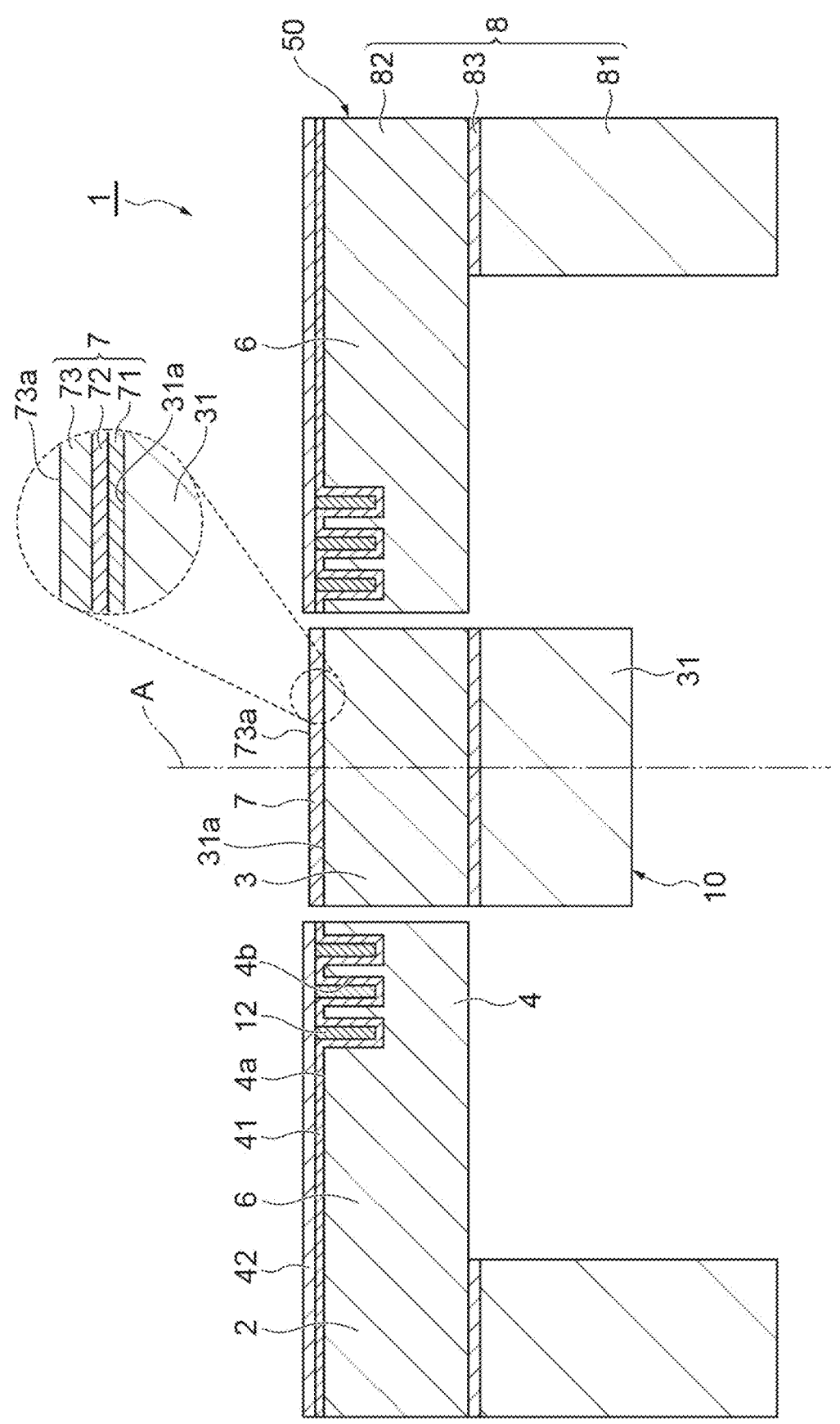
FIG. 2 A schematic cross-sectional view taken along II-II of FIG. 1.

As illustrated in FIGS. 1 and 2, a mirror device 1 has a support portion 2 and a movable mirror portion 10. The movable mirror portion 10 has a first movable portion 3, a second movable portion 4, a pair of first coupling portions 5, a pair of second coupling portions 6, and a mirror layer 7. The support portion 2, the first movable portion 3, the second movable portion 4, the pair of first coupling portions 5, and the pair of second coupling portions 6 constitute a structural body 50. In other words, the mirror device 1 includes the structural body 50 and the mirror layer 7.

The structural body 50 is integrally formed, for example, by a silicon-on-insulator (SOI) substrate 8. That is, the mirror device 1 is configured as a Micro-Electro-Mechanical Systems (MEMS) device. The SOI substrate 8 has a support layer 81, a device layer 82, and an intermediate layer 83. The support layer 81 and the device layer 82 are semiconductor layers made, for example, of silicone. The intermediate layer 83 is an insulating layer made, for example, of silicon oxide, and is disposed between the support layer 81 and the device layer 82.

The first movable portion 3 is formed, for example, in a rectangular plate shape. The second movable portion 4 is formed, for example, in a rectangular annular shape, and surrounds the first movable portion 3 when viewed in an optical axis direction A. The support portion 2 is formed, for example, in a rectangular frame shape, and surrounds the second movable portion 4 when viewed in the optical axis direction A. That is, the support portion 2 surrounds the first movable portion 3 and the second movable portion 4 when viewed in the optical axis direction A. The optical axis direction A is a direction perpendicular to a plane on which the support portion 2, the first movable portion 3, the second movable portion 4, the pair of first coupling portions 5, and the pair of second coupling portions 6 are disposed, and a direction intersecting the mirror layer 7.

The first movable portion 3 has a first part 31 and a second part 32. The first part 31 is formed, for example, in a circular shape when viewed in the optical axis direction A. The second part 32 is formed, for example, in a rectangular annular shape when viewed in the optical axis direction A. The second part 32 surrounds the first part 31 when viewed in the optical axis direction A, and is connected to the first part 31 through a pair of connecting parts 33. In this example, the pair of connecting parts 33 are disposed on a second axis X2 described further below, with the first part 31 interposed therebetween. In FIG. 2, illustration of the second part 32, the connecting parts 33, etc., is omitted. The first movable portion 3 need not have the second part 32 and the connecting parts 33.

The pair of first coupling portions 5 are disposed on a first axis X1 with the first movable portion 3 interposed therebetween, in a gap between the second part 32 of the first movable portion 3 and the second movable portion 4. Each of the first coupling portions 5 functions as a torsion bar. Each of the first coupling portions 5 couples the first movable portion 3 to the second movable portion 4 so that the first movable portion 3 is swingable about the first axis X1. Each of the first coupling portions 5 may also be regarded as coupling the first movable portion 3 to the support portion 2 through the second movable portion 4 and the second coupling portions 6 so that the first movable portion 3 is swingable about the first axis X1.

The pair of second coupling portions 6 is disposed on the second axis X2 with the second movable portion 4 interposed therebetween, in a gap between the second movable portion 4 and the support portion 2. Each of the second coupling portions 6 functions as a torsion bar. Each of the second coupling portions 6 couples the second movable portion 4 to the support portion 2 so that the second movable portion 4 is swingable about the second axis X2. When the second movable portion 4 swings about the second axis X2, the first movable portion 3 also swings about the second axis X2 together with the second movable portion 4. The first movable portion 3 is thus capable of swinging about the first axis X1 and the second axis X2. The first axis X1 and the second axis X2 are perpendicular to the optical axis direction A and intersect each other (orthogonal to each other in this example).

The support portion 2, the first movable portion 3, and the second movable portion 4 are composed of the support layer 81, the device layer 82, and the intermediate layer 83. The first coupling portions 5 and the second coupling portions 6 are composed of the device layer 82. A thickness (thickness along the optical axis direction A) of the support layer 81 forming the first movable portion 3 and the second movable portion 4 is smaller than a thickness of the support layer 81 forming the support portion 2. The support layer 81 forming the first movable portion 3 functions as a beam part that suppresses warping of the first movable portion 3 and the mirror layer 7. The first movable portion 3 and the second movable portion 4 may be composed of only the device layer 82.

The mirror layer 7 is formed in a circular shape on a surface 31a of the first part 31 of the first movable portion 3. The surface 31a is formed of a surface of the device layer 82 opposite the intermediate layer 83, and extends to intersect the optical axis direction A. The mirror layer 7 is formed in a region including an intersection point between the first axis X1 and the second axis X2. The center (centroid) of the mirror layer 7 when viewed in the optical axis direction A matches the intersection point between the first axis X1 and the second axis X2. An outer edge of the mirror layer 7 extends a constant distance away from an outer edge of the first part 31. A diameter (maximum width when viewed in the optical axis direction A) of the mirror layer 7 is 0.5 mm or more and 30 mm or less. In this example, the diameter of the mirror layer 7 is about 2 mm. The mirror layer 7 may be formed in an arbitrary shape such as elliptical, rectangular, or polygonal. Similarly, the first part 31 may be formed in an arbitrary shape such as elliptical, rectangular, or polygonal. The second part 32 of the first movable portion 3 and the second movable portion 4 may be formed in an arbitrary shape such as annular, elliptical annular, or polygonal annular.

The mirror layer 7 includes an adhesive layer 71, a diffusion prevention layer (intermediate layer) 72, and a reflective layer 73. The adhesive layer 71, the diffusion prevention layer 72, and the reflective layer 73 are stacked in this order on the surface 31a of the first part 31. The adhesive layer 71 has high adhesion to the first part 31 (silicone) compared to the diffusion prevention layer 72 and the reflective layer 73. The diffusion prevention layer 72 suppresses the occurrence of metal diffusion between the adhesive layer 71 and the reflective layer 73 during heating. A surface of the reflective layer 73 opposite the first part 31 forms a mirror surface 73a which extends to intersect the optical axis direction A. The adhesive layer 71, the diffusion prevention layer 72, and the reflective layer 73 are each formed of a metal material. For example, the adhesive layer 71 is made of titanium, the diffusion prevention layer 72 is made of platinum, and the reflective layer 73 is made of gold. A thickness of each of the adhesive layer 71 and the diffusion prevention layer 72 is, for example, about 50 nm to 300 nm, and preferably about 100 nm. A thickness of the reflective layer 73 is, for example, about 50 nm to 300 nm, and preferably about 200 nm. In the case in which the thickness of the adhesive layer 71 or the diffusion prevention layer 72 is 50 nm or more, an adhesive function of the adhesive layer 71 or a diffusion prevention function of the diffusion prevention layer 72 can be effectively exhibited. In the case in which the thickness of the reflective layer 73 is 50 nm or more, the reflectivity of the reflective layer 73 can be increased. In the case in which the thickness of the adhesive layer 71, the diffusion prevention layer 72, or the reflective layer 73 is 300 nm or less, a stress generated in the adhesive layer 71, the diffusion prevention layer 72, or the reflective layer 73 can be reduced, so that an amount of warp of the mirror layer 7 prior to a heating step described further below can be reduced and the change in the amount of warp of the mirror layer 7 in the heating step can be reduced. The diffusion prevention layer 72 may be formed of tungsten. The reflective layer 73 may be formed of aluminum. In the case in which the reflective layer 73 is made of gold, the reflectivity for light in the near-infrared range can be increased compared with the case in which the reflective layer 73 is made of aluminum.

A compressive stress (force in a direction of convex warping) or a tensile stress (force in a direction of concave warping) is generated as a residual stress, as described further below, in each of the adhesive layer 71, the diffusion prevention layer 72, and the reflective layer 73 forming the mirror layer 7. The type (compressive or tensile) and magnitude of the stress is determined by manufacturing conditions such as the material, thickness, area, film-forming temperature, and the like of each layer. Adjusting the material, area, film-forming temperature, and the like makes it possible to adjust the type and magnitude of the stress in a state prior to the heating step described further below and the amount of change in warp in the heating step. As one example, in this embodiment, the adhesive layer 71 and the diffusion prevention layer 72 are formed so that a compressive stress remains in the state prior to the heating step (at the completion of a second forming step described further below), and the reflective layer 73 is formed so that a tensile stress remains in the state prior to the heating step (at the completion of the second forming step). Combining layers having a compressive stress and a layer having a tensile stress enables the amount of warp of the mirror layer 7 and the first movable portion 3 prior to the heating step to be reduced. Additionally, when made of the same material, the greater the thickness, the greater the stress generated. It is thus preferable for the thickness of each layer to be small from the viewpoint of reducing the amount of warp prior to the heating step and the change in the amount of warp in the heating step.

The mirror device 1 further has a first drive coil 11, a second drive coil 12, wires 15a, 15b, wires 16a, 16b, electrode pads 21a, 21b, and electrode pads 22a, 22b. In FIG. 1, the first drive coil 11 and the second drive coil 12 are shown in dash-dot lines, and the wires 15a, 15b and the wires 16a, 16b are shown in solid lines. The first drive coil 11, the second drive coil 12, etc., are actually covered by an insulating layer 42 described below.

The first drive coil 11 is provided in the second part 32 of the first movable portion 3. The first drive coil 11 is wound around a plurality of times in a spiral (coil shape). A magnetic field generated by a magnetic field generating portion (not shown) acts on the first drive coil 11. The magnetic field generating portion includes, for example, permanent magnets arranged in a Halbach array.

The first drive coil 11 is disposed in a groove formed in a surface of the second part 32. That is, the first drive coil 11 is embedded in the first movable portion 3. The first drive coil 11 is disposed in the groove via an insulating layer 41. The insulating layer 41 is, for example, a silicon nitride film. The insulating layer 41 is formed over the surface of the support portion 2, the first movable portion 3, the second movable portion 4, the pair of first coupling portions 5, and the pair of second coupling portions 6, but not over the first part 31 of the first movable portion 3. The insulating layer 42 made, for example, of silicon nitride is formed on the insulating layer 41.

One end of the first drive coil 11 is connected to the electrode pad 21a through the wire 15a. The wire 15a extends from the first movable portion 3 to the support portion 2 through one of the first coupling portions 5, the second movable portion 4, and one of the second coupling portions 6. The wire 15a and the electrode pad 21a are integrally formed, for example, of a metal material such as tungsten, aluminum, gold, silver, copper, or aluminum-based alloy. The wire 15a is provided on the surface of one of the first coupling portions 5, the second movable portion 4, and one of the second coupling portions 6 as a surface wire. The wires 15b, 16a, 16b described below are also provided as surface wires similarly to the wire 15a.

The other end of the first drive coil 11 is connected to the electrode pad 21b through the wire 15b. The wire 15b extends from the first movable portion 3 to the support portion 2 through the other of the first coupling portions 5, the second movable portion 4, and the other of the second coupling portions 6. The wire 15b and the electrode pad 21b are integrally formed of the same metal material as that of the wire 15a.

The second drive coil 12 is provided in the second movable portion 4. The second drive coil 12 is wound around a plurality of times in a spiral (coil shape) in the second movable portion 4. A magnetic field generated by a magnetic field generating portion acts on the second drive coil 12. The second drive coil 12 is disposed in a groove 4b formed in a surface 4a of the second movable portion 4. That is, the second drive coil 12 is embedded in the second movable portion 4. The second drive coil 12 is disposed in the groove via the insulating layer 41.

One end of the second drive coil 12 is connected to the electrode pad 22a through the wire 16a. The wire 16a extends from the second movable portion 4 to the support portion 2 through one of the second coupling portions 6. The wire 16a and the electrode pad 22a are integrally formed of the same metal material as that of the wire 15a.

The other end of the second drive coil 12 is connected to the electrode pad 22b through the wire 16b. The wire 16b extends from the second movable portion 4 to the support portion 2 through the other of the second coupling portions 6. The wire 16b and the electrode pad 22b are integrally formed of the same metal material as that of the wire 15a.

First to fifth examples will be described below as examples of operation of the movable mirror portion 10 of the mirror device 1. In the first example, a high frequency drive current is applied to the first drive coil 11. Since a magnetic field generated by the magnetic field generating portion is acting on the first drive coil 11 at this time, a Lorentz force is generated in the first drive coil 11. The first movable portion 3 swings about the first axis X1, for example, at a resonant frequency level by the Lorentz force acting as a driving force.

A drive current of a constant magnitude is applied to the second drive coil 12. Since a magnetic field generated by the magnetic field generating portion is acting on the second drive coil 12 at this time, a Lorentz force is generated in the second drive coil 12. The second movable portion 4 rotates about the second axis X2 and stops in that state, for example, according to the magnitude of the drive current, by the Lorentz force acting as a driving force. The mirror device 1 thus enables light from a light source that enters along the optical axis direction A to be reflected from the mirror surface 73a and scanned. In the first example, the first movable portion 3 swings at a resonant frequency and the second movable portion 4 is used statically.

Similarly to the operation of the first movable portion 3 in the first example, in the second example, a high frequency drive current is applied to the first drive coil 11, so that the first movable portion 3 swings according to a resonant frequency, and a high frequency drive current is applied to the second drive coil 12, so that the second movable portion 4 swings according to a resonant frequency. Thus, in the second example, both the first movable portion 3 and the second movable portion 4 swing at a resonant frequency.

Similarly to the operation of the second movable portion 4 in the first example, in the third example, a drive current of a constant magnitude is applied to the first drive coil 11, so that the first movable portion 3 rotates about the first axis X1 and stops according to the magnitude of the drive current, and a drive current of a constant magnitude is applied to the second drive coil 12, so that the second movable portion 4 rotates about the second axis X2 and stops according to the magnitude of the drive current. Thus, in the third example, both the first movable portion 3 and the second movable portion 4 are used statically.

In the fourth and fifth examples, only the first movable portion 3 is driven. In the fourth example, a high frequency drive current is applied to the first drive coil 11, so that the first movable portion 3 swings at a resonant frequency. In the fifth example, a drive current of a constant magnitude is applied to the first drive coil 11, so that the first movable portion 3 rotates about the first axis X1 and stops according to the magnitude of the drive current. The fourth and fifth examples may be used, for example, in a case in which the second movable portion 4 is not provided.

[Method for Manufacturing a Mirror Device]

A method for manufacturing the mirror device 1 will be described with reference to FIGS. 3 to 8. First of all, a pre-processed SOI wafer 80 is prepared (preparation step, FIG. 3(*a*)). The SOI wafer 80 has the support layer 81, the device layer 82, and the intermediate layer 83. The SOI wafer 80 has a plurality of regions R. Each of the plurality of regions R is to become the SOI substrate 8 of the mirror device 1 after a cutting step described further below. The regions R are set, for example, to be arranged in a lattice with dicing lines L set in the boundaries between adjacent regions R. The SOI wafer 80 is cut along the dicing lines L in the cutting step.

Figure 3:
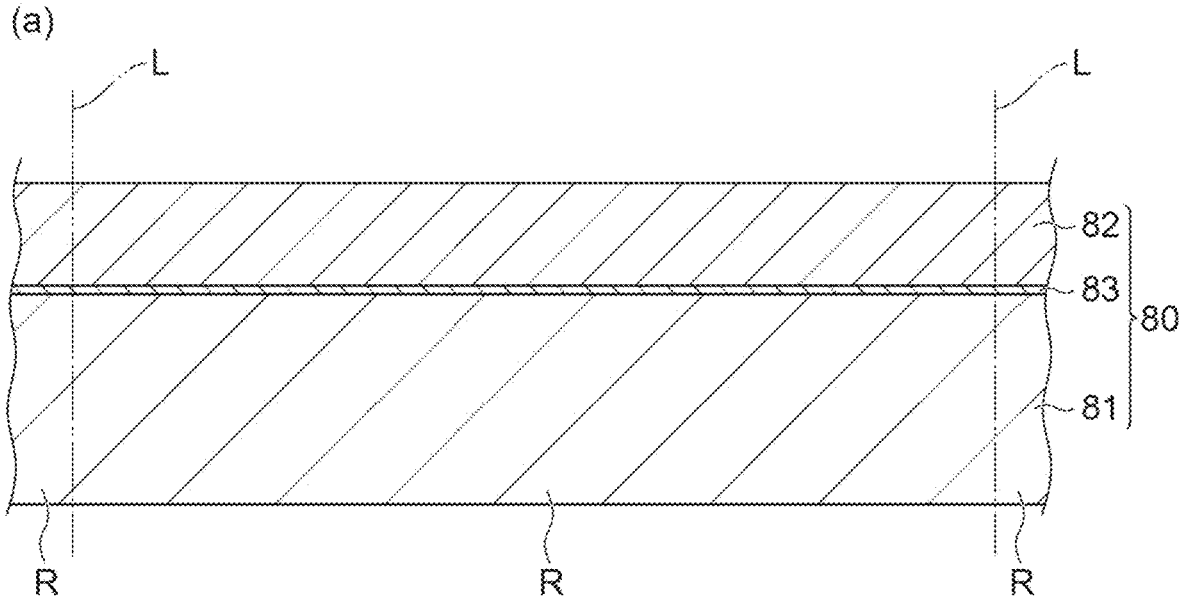
FIGS. 3 (a) and (b) are diagrams to describe a method for manufacturing a mirror device.
Figure 3:
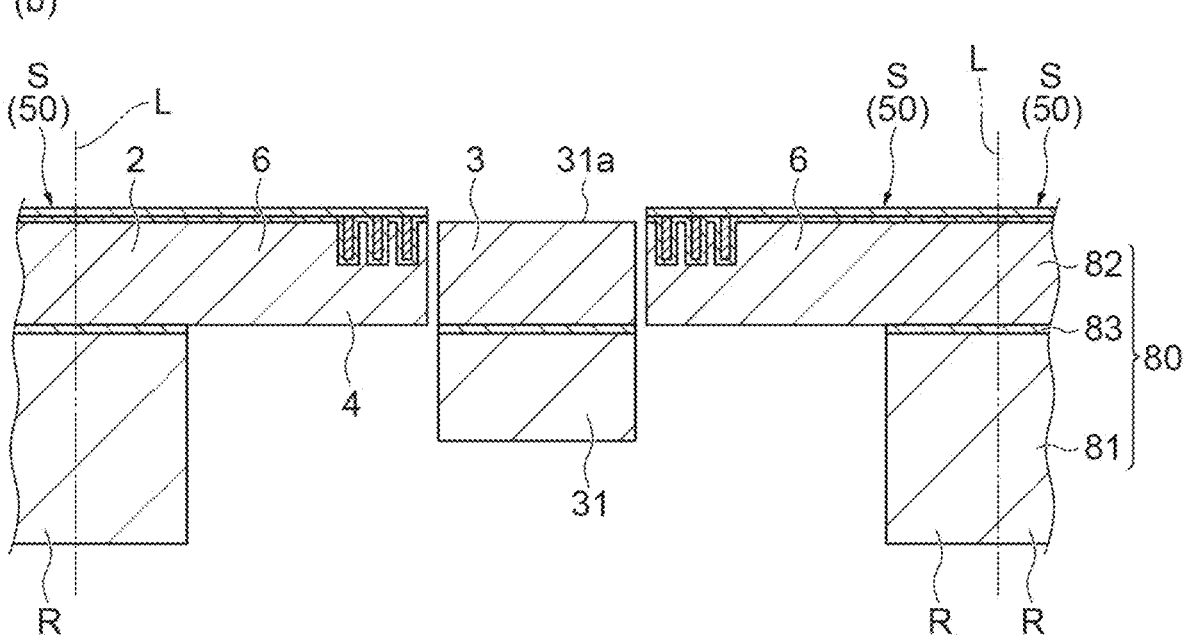

A plurality of parts S that respectively correspond to the structural bodies 50 are then formed in the SOI wafer 80 (first forming step, FIG. 3(*b*)). A "part that corresponds to the structural body 50" means a part that is to become the structural body 50 after the cutting step. In the first forming step, the structural body 50 is formed in each of the plurality of regions R. The structural body 50 is composed of the support portion 2, the first movable portion 3, the second movable portion 4, the pair of first coupling portions 5, and the pair of second coupling portions 6 as described above. The structural body 50 (part S) is formed using MEMS technology (patterning, etching, etc.). In the first forming step, the first drive coil 11, the second drive coil 12, etc., are formed in each of the plurality of regions R. In the first forming step, the first movable portion 3 becomes swingable about the first axis X1 relative to the second movable portion 4 and swingable about the first axis X1 and the second axis X2 relative to the support portion 2, and the second movable portion 4 becomes swingable about the second axis X2 relative to the support portion 2.

In the first forming step, for example, the first drive coil 11, the second drive coil 12, the wires 15*a*, 15*b*, 16*a*, 16*b*, and the electrode pads 21*a*, 21*b*, 22*a*, 22*b* are first formed in each region R (wiring forming step). Then, the support portion 2, the first movable portion 3, the second movable portion 4, the pair of first coupling portions 5, and the pair of second coupling portions 6 are formed in each region R (structural body forming step). The structural body forming step may be performed prior to the wiring forming step.

Subsequently, the mirror layer 7 is formed on a part of each of the plurality of parts S, corresponding to the first movable portion 3 (second forming step, FIG. 4(*a*)). More specifically, the mirror layer 7 composed of the adhesive layer 71, the diffusion prevention layer 72, and the reflective layer 73 is formed on the surface 31*a* of the first part 31 of the first movable portion 3. Although the mirror layer 7 is formed by sputtering (sputtering method) in this example, the mirror layer 7 may also be formed by vapor deposition (vapor deposition method).

Figure 5:
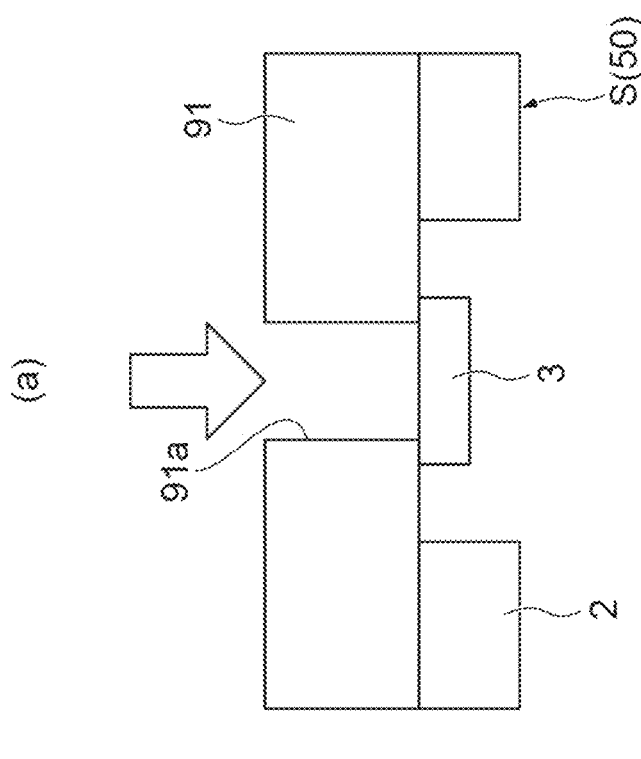
FIGS. 5 (a) and (b) are diagrams to describe steps for forming a mirror layer.
Figure 5:
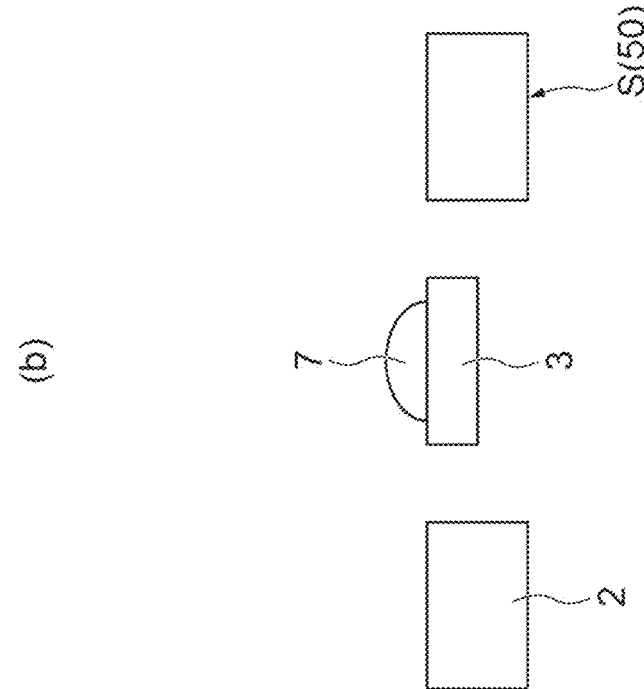

FIGS. 5(*a*) and 5(*b*) are diagrams to describe the second forming step. Firstly, a shadow mask 91 made of silicone is disposed on the plurality of parts S as illustrated in FIG. 5(*a*). An opening 91*a* exposing a region in which the mirror layer 7 is to be formed is formed in the shadow mask 91. Secondly, the mirror layer 7 is formed by sputtering as illustrated in FIG. 5(*b*). The shadow mask 91 is removed after the mirror layer 7 is formed. The mirror layer 7 formed by sputtering is thicker at the center than at the edges as illustrated in FIG. 5(*b*). The opening 91*a* of the shadow mask 91 may be larger than the mirror layer 7. In this case, the mirror layer 7 having a uniform thickness can be formed.

In the case in which the mirror layer 7 is formed by sputtering or vapor deposition, the temperature of the SOI wafer 80 during the processing rises, for example, to near 100° C. When the temperature of the SOI wafer 80 drops from this state, a residual stress may be generated in the mirror layer 7, for example, due to the difference in the rate of thermal expansion between the mirror layer 7 and the SOI wafer 80. In this case, the mirror layer 7 and the first movable portion 3 may warp due to the residual stress.

More specifically, it is considered that a residual stress is generated in the mirror layer 7 due to the following three reasons.

(1) Difference in the rate of thermal expansion between the mirror layer 7 and the SOI wafer 80.

(2) Difference in the lattice constant between the mirror layer 7 and the SOI wafer 80.

(3) Argon atom trapping in the SOI wafer 80 and the mirror layer 7 due to sputtering.

Regarding (1), the temperature of the SOI wafer 80 may be raised during the forming of the mirror layer 7. The mirror layer 7 and the SOI wafer 80 contract when the temperature returns to room temperature from this state. The degree of contraction differs depending on the rate of thermal expansion. In a case in which the rate of thermal expansion of the mirror layer 7 is smaller than the rate of thermal expansion of the SOI wafer 80, a compressive stress is generated in the mirror layer 7 to cause the mirror layer 7 to warp convexly. In a case in which the rate of thermal expansion of the mirror layer 7 is greater than the rate of thermal expansion of the SOI wafer 80, a tensile stress is generated in the mirror layer 7 to cause the mirror layer 7 to warp concavely. A residual stress is generated in the mirror layer 7 not only due to the difference in the rate of thermal expansion between the mirror layer 7 and the SOI wafer 80, but also due to the difference in the rate of thermal expansion between the plurality of layers (the adhesive layer 71, the diffusion prevention layer 72, and the reflective layer 73) forming the mirror layer 7.

Regarding (2), the lattice constant of the mirror layer 7 is different from the lattice constant of the SOI wafer 80. The lattice constant of the mirror layer 7 tends to approach the lattice constant of the SOI wafer 80 in the vicinity of a boundary surface between the mirror layer 7 and the SOI wafer 80, whereas the lattice constant of the mirror layer 7 approaches a material specific value with increasing distance from the boundary surface. The mirror layer 7 thus deforms in the vicinity of the boundary surface, and a stress is generated accordingly. A residual stress is generated in the mirror layer 7 not only due to the difference in the lattice constant between the mirror layer 7 and the SOI wafer 80, but also due to the difference in the lattice constant between the plurality of layers (the adhesive layer 71, the diffusion prevention layer 72, and the reflective layer 73) forming the mirror layer 7.

Regarding (3), in sputtering, sputtered atoms ejected from a target enter the SOI wafer 80 and form a thin film. At the same time, positive argon ions colliding with the target are neutralized at a constant rate, and enter the SOI wafer 80 and the mirror layer 7 being formed, with high kinetic energy. The argon atoms entering the crystal lattice in the mirror layer 7 and expanding the lattice spacing generate a compressive stress in the mirror layer 7 to cause the mirror layer 7 to warp convexly.

Figure 9:
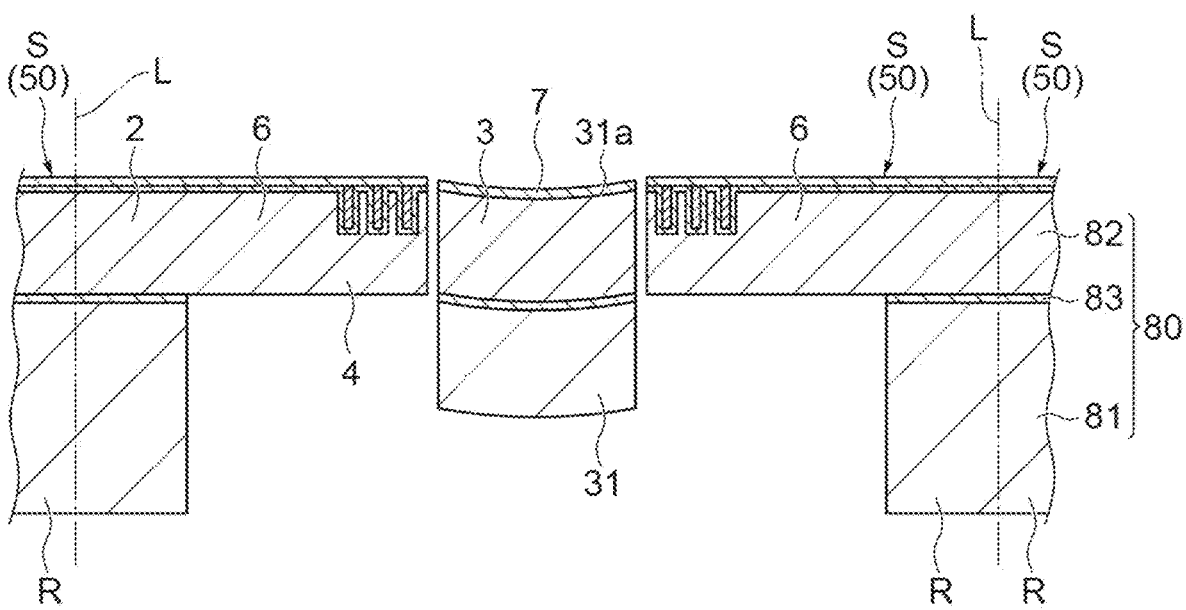
FIGS. 9 (a) and (b) are diagrams to describe the method for manufacturing a mirror device according to a modification example.
Figure 9:
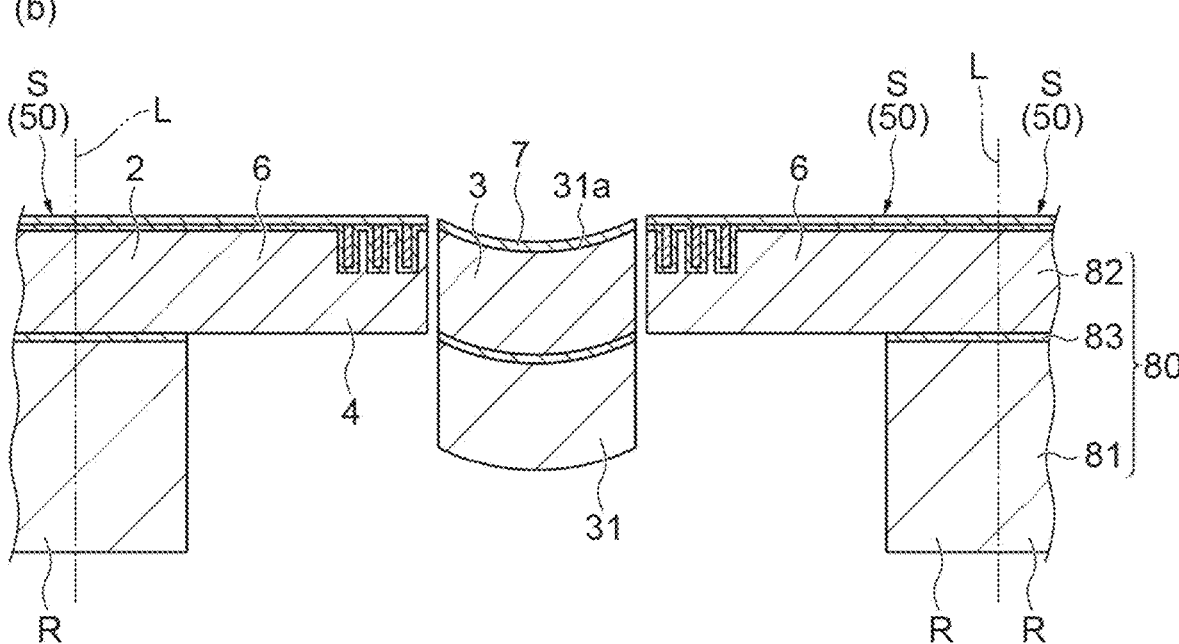

The direction and degree of warp of the mirror layer 7 and the first movable portion 3 change due to the material, thickness, area, forming method, and the like of the mirror layer 7. For example, although in this embodiment, the mirror layer 7 curves convexly as illustrated in FIG. 4(*a*), the mirror layer 7 may curve concavely as illustrated in FIG. 9(*a*) described further below. The greater the area (diameter)

of the mirror layer 7, the greater the amount of warp of the mirror layer 7. As described above, a compressive stress remains in the adhesive layer 71 and the diffusion prevention layer 72, and a tensile stress remains in the reflective layer 73 at the completion of the second forming step. These stresses may also remain after the heating step. That is, it is only required that a compressive stress remains in the adhesive layer 71 and the diffusion prevention layer 72, and a tensile stress remains in the reflective layer 73 at least at the completion of the second forming step.

Figure 4:
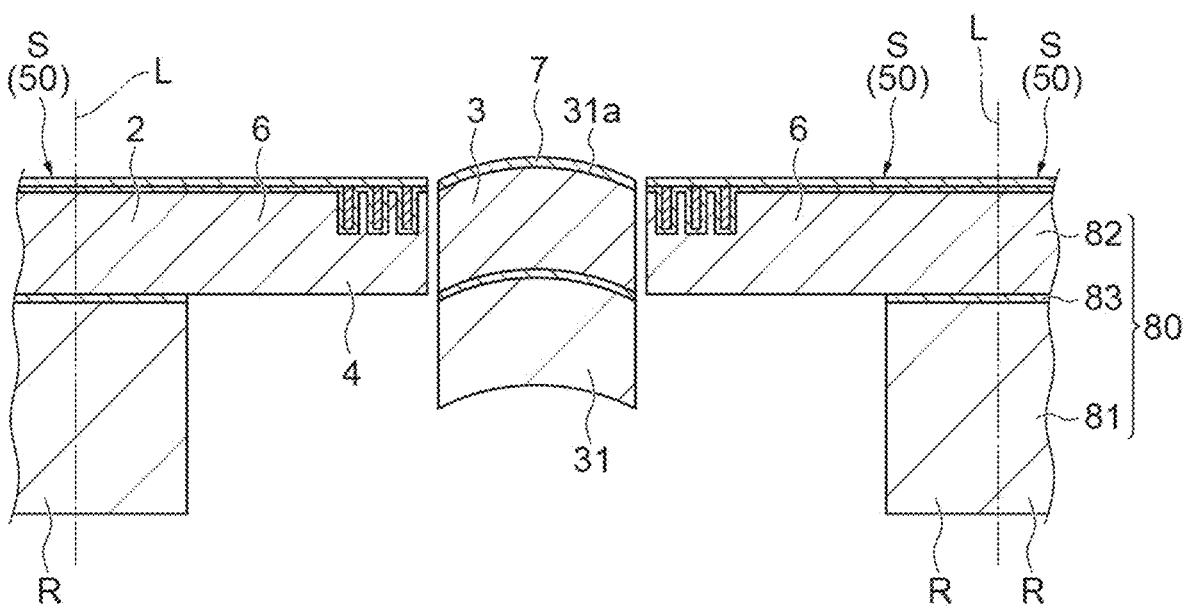
FIGS. 4 (a) and (b) are diagrams to describe the method for manufacturing a mirror device.
Figure 4:
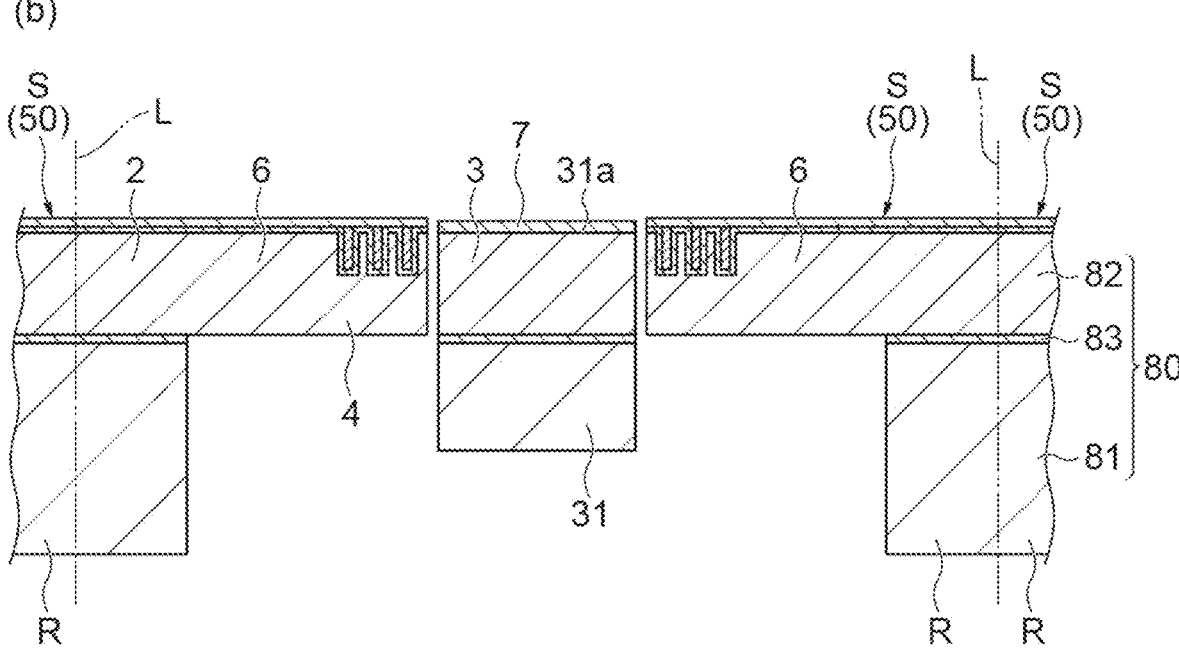

The SOI wafer 80 is then heated (heating step, FIG. 4(*b*)). In this example, the entire SOI wafer 80 is heated. Heating the SOI wafer 80 relieves the residual stress present in the mirror layer 7 (annealing process). In this embodiment, the amount of warp of the mirror layer 7 is reduced by the relief of the residual stress, and the mirror layer 7 is flattened. After the heating step, a cleaning step of cleaning the SOI wafer 80 is performed. The cleaning step may be performed when foreign matter adheres to the mirror layer 7 in the heating step, may always be performed, or may be omitted.

It is considered that the residual stress is relieved by the following reasons in the heating step. One reason is the formation of a stress relief layer (alloy layer) between the mirror layer 7 and the SOI wafer 80. A portion of the atoms forming the mirror layer 7 diffuse in the heating step. It is considered that, due to this diffusion of the atoms, a stress relief layer (alloy layer) that reduces the difference in the lattice constant is formed between the mirror layer 7 and the SOI wafer 80 or between the adhesive layer 71, the diffusion prevention layer 72, and the reflective layer 73 forming the mirror layer 7, to thereby relieve the residual stress. Another reason is that the argon atoms trapped in the crystal lattice in the mirror layer 7 as described in (3) above are released into the atmosphere in the heating step, to thereby relieve residual stress.

Figure 6:
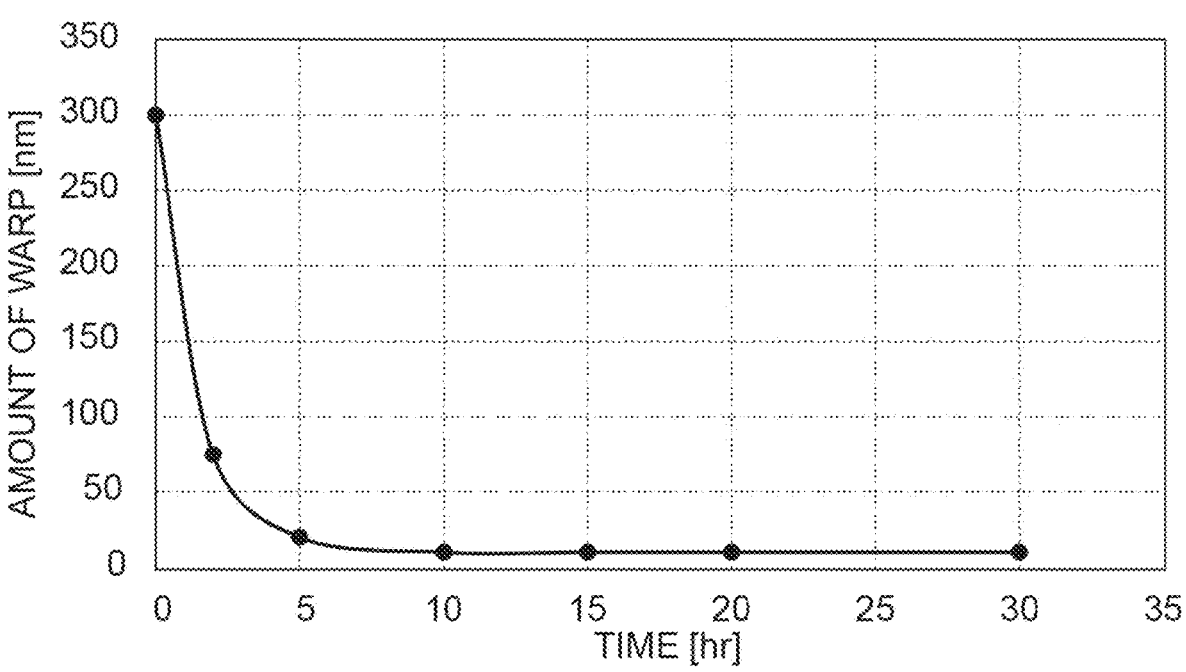
FIG. 6 A graph illustrating an example of the change in an amount of warp of the mirror layer in a heating step.

FIG. 6 is a graph illustrating an example of the change in the amount of warp of the mirror layer 7 in the heating step. The horizontal axis represents the elapsed time (unit: hour) from the start of heating, and the vertical axis represents the amount of warp (unit: nm) of the mirror layer 7. In this example, the SOI wafer 80 is heated at 150° C. for 30 hours. As illustrated in FIG. 6, it can be seen that although the amount of warp is about 300 nm at the start of heating, the mirror layer 7 is substantially flattened by the heating step, and the change in the amount of warp is reduced over time. The amount of warp of the mirror layer 7 is a value measured by the same method as that of a measuring step described further below.

A heating temperature for heating the SOI wafer 80 in the heating step is set, for example, to 60° C. or higher and 300° C. or lower. This is because although the higher the heating temperature, the less the heating time, if the heating temperature is too high, defects such as cracks or metal diffusion may occur. The heating temperature of 150° C. in the embodiment is a value obtained by adding 70° C., which is assumed to be a self-heating temperature, and 10° C., which is a margin temperature, to 70° C., which is assumed to be a maximum value of the environmental temperature of the mirror device 1. The heating time is set to more than or equal to the time it takes for the change in the amount of warp to become saturated and be reduced on the basis of the relationship between time and the amount of warp obtained in advance. For example, in the case of FIG. 6, the change in the amount of warp reaches saturation in about five hours, so that the heating time is five hours or more. Setting the heating time to about the time it takes for the change in the amount of warp to reach saturation enables energy for heating to be reduced. The heating temperature is preferably set to at least higher than the self-heating temperature of the mirror device 1 (temperature of the mirror device 1 during operation) to reliably suppress the change in the amount of warp for the user.

The SOI wafer 80 is disposed inside a thermostatic chamber (oven) during heating. The entire SOI wafer 80 is thus heated, and the parts of the plurality of parts S, corresponding to the first movable portion 3, are heated at the same time. One SOI wafer 80 may be disposed in the thermostatic chamber, or a plurality of (for example, two, six, or twelve) SOI wafers 80 may be disposed therein. The SOI wafer 80 may be disposed horizontally or perpendicularly (along a vertical direction) in the thermostatic chamber. The oven is preferably a clean oven from the viewpoint of preventing adhesion of foreign matter to the mirror layer 7. In the case in which a plurality of the SOI wafers 80 are disposed along the vertical direction in the thermostatic chamber in the heating step, the following operational effects can be produced. That is, heating the plurality of the SOI wafers 80 at the same time enables the manufacturing efficiency to improve. Disposing the plurality of the SOI wafers 80 in the thermostatic chamber may increase the variation in the temperature in the thermostatic chamber due to the influence of convection of air or the like, but this manufacturing method is capable of achieving uniformity of the temperature of the mirror layer 7 among the plurality of parts S. Additionally, disposing the plurality of the SOI wafers 80 perpendicularly makes it difficult for particles to be deposited on the mirror layer 7 in the heating step, and suppresses the reduction in yield due to adhesion of foreign matter even if minute particles are present in the thermostatic chamber. In the mirror device 1, even minute particles can have a large impact on the scanning light if adhered to the mirror layer 7. Furthermore, an increase in the heating time in the heating step increases the chance of the particles being deposited on the mirror layer 7. Thus, the manufacturing method above which is capable of suppressing the deposit of foreign matter in the heating step is effective.

The amount of warp of the mirror layer 7 may decrease due to the heating step such as in this embodiment, or may increase due to the heating step. Whether the amount of warp increases or decreases depends on the material, thickness, area, forming method, and the like of the mirror layer 7. Although the mirror layer 7 is convexly curved prior to heating and the amount of warp of the mirror layer 7 decreases due to the heating step in this embodiment, the mirror layer 7 may be convexly curved prior to heating and the amount of warp of the mirror layer 7 may increase due to the heating step. Additionally, the mirror layer 7 may be concavely curved prior to heating, and the amount of warp of the mirror layer 7 may increase due to the heating step such as in a variation described further below. Alternatively, the mirror layer 7 may be concavely curved prior to heating, and the amount of warp of the mirror layer 7 may decrease due to the heating step. The mirror layer 7 that is convexly curved prior to heating may concavely curve due to the heating step, or the mirror layer 7 that is concavely curved prior to heating may convexly curve due to the heating step. An increase in the amount of warp means an increase in the absolute value of the amount of warp. For example, when the amount of warp changes from 200 nm to 300 nm, or from −200 nm to −300 nm. A decrease in the amount of warp means a decrease in the absolute value of the amount of warp. For example, when the amount of warp changes from 200 nm to 100 nm, or from −200 nm to −100 nm. The amount of warp being a positive value means that the height of the mirror layer 7 is greater at the center than at the periphery (i.e., is convex), and the amount of warp being a negative value means that the height of the mirror layer 7 is smaller at the center than at the periphery (i.e., is concave).

Subsequently, the amount of warp of the mirror layer 7 is measured in each of the plurality of parts S (measuring step). For example, a PV value and shape data (3D data) of the mirror layer 7 are measured using a laser interferometer. The diameter of the mirror layer 7 in this embodiment is 2 mm as described above. The PV value and shape data of an area having a diameter of 1.9 mm and concentric with the mirror layer 7 is measured in this embodiment. The PV value represents a difference in height between a highest point and a lowest point of the mirror layer 7 (mirror surface 73*a*) in a measuring range. Since the PV value is expressed as an absolute value, the shape data is also measured to determine whether the mirror layer 7 is convex or concave (whether the amount of warp is a positive value or a negative value). A predetermined mark is applied (marking) to the structural body 50 in which the amount of warp of the mirror layer 7 is greater than a predetermined value. The marked structural body 50 (mirror device 1) is removed, for example, after the cutting step. The amount of warp of the mirror layer 7 may also be measured by measuring a curvature of the mirror layer 7.

Figure 7:
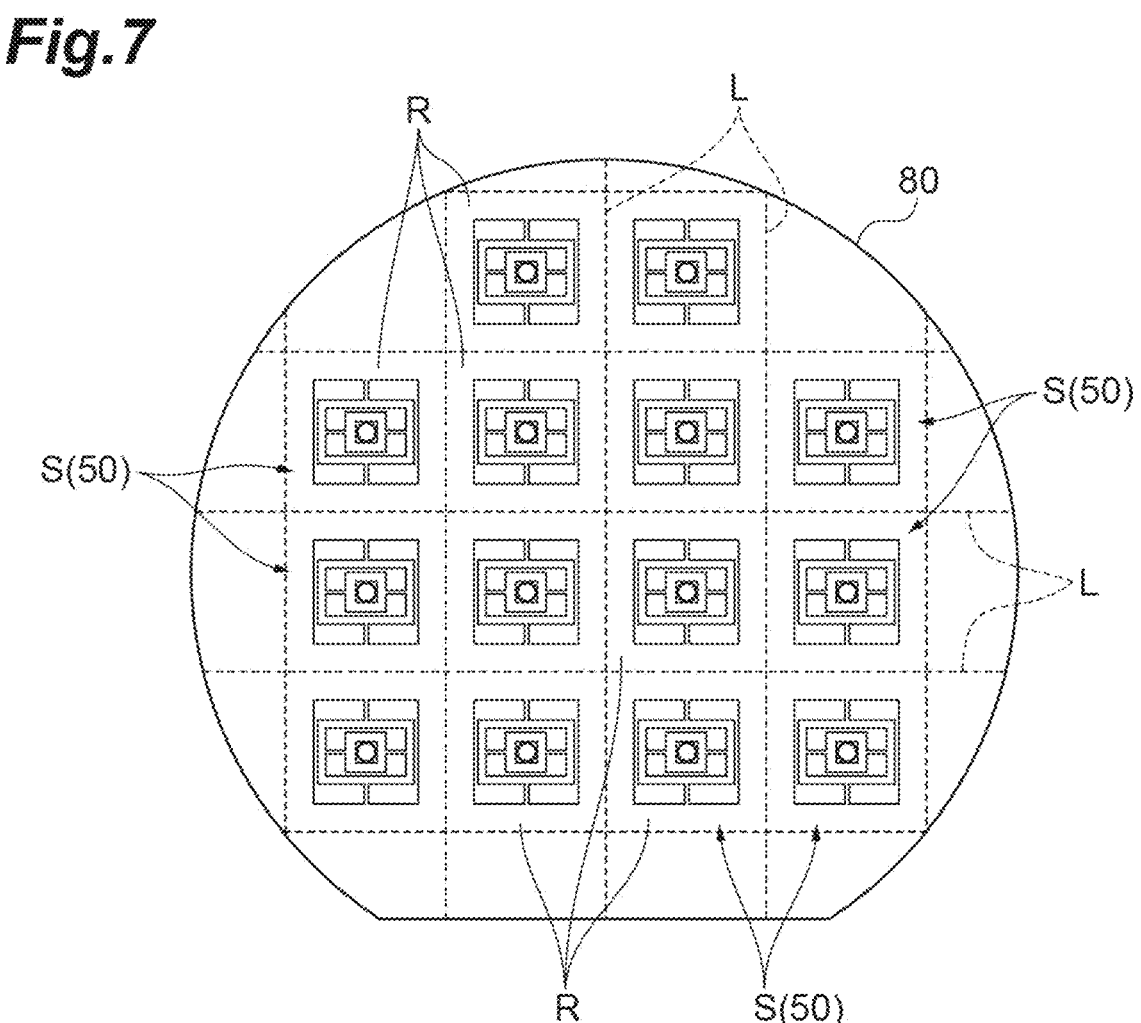
FIG. 7 A diagram to describe a cutting step.

The SOI wafer 80 is then cut at the dicing lines L so that the plurality of parts S are separated from one another (cutting step, FIG. 7). For example, the SOI wafer 80 is cut by forming a modified region inside the SOI wafer 80 along the dicing lines L by irradiation of laser light, and extending cracks in a thickness direction of the SOI wafer 80 from the modified region by tape expansion or the like. In the cutting step, the SOI wafer 80 may be cut by other cutting methods such as blade dicing. A plurality of the mirror devices 1 are obtained by the steps above.

Figure 8:
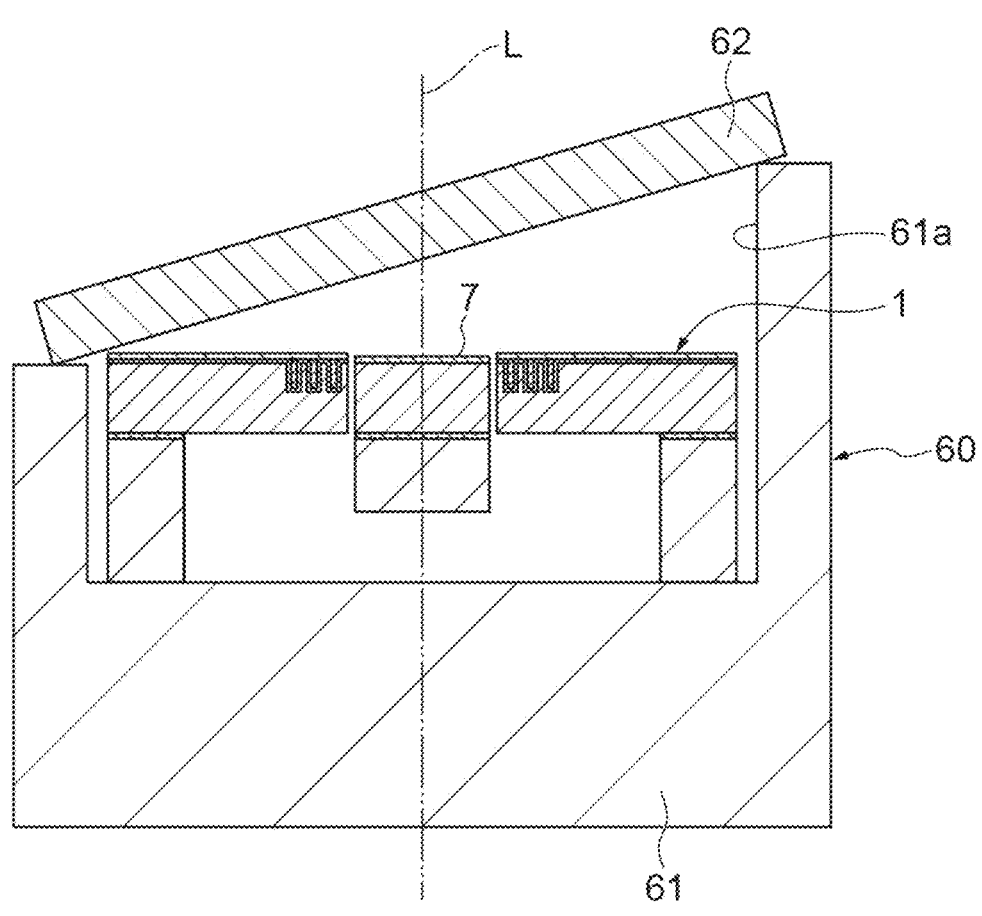
FIG. 8 A cross-sectional view of a mirror device contained in a package.

Each of the mirror devices 1 is then contained in a package 60 as illustrated in FIG. 8. The package 60 has a body portion 61 that contains the mirror device 1, and a transparent window member 62 that is disposed to close an opening 61*a* of the body portion 61. Light reflected from the mirror device 1 passes through the window member 62 and enters the mirror layer 7.

[Function and Effect]

As described above, a residual stress may be generated in the mirror layer 7 when forming the mirror layer 7, and the mirror layer 7 may warp due to the residual stress. If the mirror device 1 is shipped in this state, there is a concern that the amount of warp of the mirror layer 7 may change due to the relief of the residual stress due to environmental temperature or self-heating during use. However, in the method for manufacturing the mirror device 1 according to the embodiment, the SOI wafer 80 (part of each of the plurality of parts S, corresponding to the first movable portion 3) is heated after the plurality of parts S, each corresponding to the structural body 50, are formed on the SOI wafer 80 and after the mirror layer 7 is formed on the part of each of the plurality of parts S, corresponding to the first movable portion 3. This enables the residual stress present in the mirror layer 7 to be relieved (released), and the change in the amount of warp of the mirror layer 7 to be suppressed during use of the mirror device 1. As a result, the change in the size or focal position of a spot of laser light reflected from the mirror layer 7 during use of the mirror device 1 can be suppressed. Additionally, in the method for manufacturing the mirror device 1 according to the embodiment, the SOI wafer 80 is cut after the heating step. This enables uniformity of the temperature of the mirror layer 7 among the plurality of parts S to be achieved during heating compared to a case in which a heating process is performed after cutting the wafer. That is, the heating process is performed, for example, in a thermostatic chamber as described above, and there may be a variation in the temperature depending on the position inside the thermostatic chamber due to the influence of convection of air, the positions of the heat source and the object to be heated, and the like. In the case in which the heating process is performed for each chip after cutting the wafer (after chipping), there is a concern that the chip may be heated at a temperature different from the set temperature depending on the position in which the chip is disposed. However, in the method for manufacturing the mirror device 1 according to the embodiment, the heating process is performed with the SOI wafer 80 in a state of high thermal conductivity, so that heat is conducted easily in the SOI wafer 80 and uniformity of the temperature of the mirror layer 7 among the plurality of parts S can be achieved. As a result, the variation in the quality of the mirror device 1 can be suppressed. Heating in the wafer state enables many mirror devices 1 to be disposed inside the thermostatic chamber. As a result, the manufacturing efficiency of the mirror device 1 can be improved. Additionally, the amount of warp of the mirror layer 7 can be measured in the wafer state in the measuring step. This enables the position of the mirror layer 7 to be accurately determined, so that the measurement efficiency can be improved. Additionally, in the case in which the cleaning step of cleaning the mirror layer 7 is performed after heating, cleaning can be performed in the wafer state, so that the work efficiency of cleaning can be improved. Additionally, in the method for manufacturing the mirror device 1 according to the embodiment, the SOI wafer 80 is cut after the heating step, so that semiconductor material forming fragments of the SOI wafer 80 generated during cutting and adhered to the mirror layer 7 can be prevented from diffusing into the mirror layer 7, and the quality of the mirror device 1 can be ensured. The need to form a protective layer on the mirror layer 7 to prevent adhesion of the fragments to the mirror layer 7 is also eliminated. Additionally, in a case in which the heating step is performed after the mirror device 1 is contained inside the package 60, an upper limit of the heating temperature will be limited since the sealing resin or the like that is used for the package 60 may deteriorate due to heating. However, in the method for manufacturing the mirror device 1 according to the embodiment, heating is performed in the wafer state, so that the heating temperature can be set regardless of the degradation onset temperature of the sealing resin, and the manufacturing efficiency can be improved. As described above, the mirror device 1 having a movable portion can be favorably manufactured by the method for manufacturing the mirror device 1 according to the embodiment.

The measuring step of measuring the amount of warp of the mirror layer 7 is performed between the heating step and the cutting step. This enables the amount of warp of the mirror layer 7 to be measured in the wafer state and the measurement efficiency to be improved.

In the cutting step, the SOI wafer 80 is cut by forming a modified region inside the SOI wafer 80 by irradiation of laser light, and extending cracks in the thickness direction of the SOI wafer 80 from the modified region (stealth dicing). This enables the stress acting on the SOI wafer 80 during cutting to be reduced, and deformation of the mirror layer 7 and the first movable portion 3 due to the stress to be suppressed. The change in the amount of warp of the mirror layer 7 during cutting can also be suppressed. Additionally, in the embodiment above, using stealth dicing which is capable of suppressing damages to and the change in the amount of warp of the first movable portion 3 is particularly effective since the first movable portion 3 is swingable prior to the cutting step and the mirror layer 7 is heated prior to the cutting step.

The second forming step is performed after the first forming step. This enables reduction in the quality of the mirror layer 7 due to the heat when forming the plurality of parts S to be suppressed. That is, if, unlike the embodiment above, the plurality of parts S are formed on the SOI wafer 80 after the mirror layer 7 is formed on the part corresponding to the first movable portion 3, metal may diffuse between the adhesive layer 71 (titanium) and the reflective layer 73 (gold) forming the mirror layer 7 due to the heat when forming the plurality of parts S, and the reflectivity of the mirror layer 7 may be reduced. In contrast, this can be prevented by forming the mirror layer 7 after the plurality of parts S are formed such as in the embodiment above to ensure the quality of the mirror layer 7. Forming the diffusion prevention layer 72 of tungsten enables metal diffusion between the adhesive layer 71 and the reflective layer 73 to be effectively suppressed compared to a case in which the diffusion prevention layer 72 is formed of platinum. In contrast, forming the diffusion prevention layer 72 of platinum enables the stress generated by the diffusion prevention layer 72 to be reduced and facilitates handling compared to the case in which the diffusion prevention layer 72 is formed of tungsten.

The amount of warp of the mirror layer 7 is reduced by heating the SOI wafer 80 in the heating step. The residual stress present in the mirror layer 7 can thus be relieved, and the change in the amount of warp of the mirror layer 7 can be suppressed during use of the mirror device 1. The amount of warp of the mirror layer 7 may also be increased by heating the SOI wafer 80 in the heating step as described above. The residual stress present in the mirror layer 7 can also be relieved, and the change in the amount of warp of the mirror layer 7 can also be suppressed during use of the mirror device 1 in this case.

The mirror layer 7 is formed by sputtering in the second forming step. This enables the mirror layer 7 to be favorably formed. That is, in the case in which the mirror layer 7 is formed by sputtering, there tends to be fewer damages and the like to the structural body 50 which includes a hollow structural body since there is no need to rotate the wafer such as in the case of vapor deposition. Additionally, metal does not tend to adhere to places other than the mirror layer 7 in sputtering which is highly directional. In vapor deposition, which is less directional, metal may pass through slits (gaps) between the support portion 2 and the movable mirror portion 10, and may enter into a rear side of the movable mirror portion 10 or adhere to the support portion 2. This can be prevented by using sputtering which is highly directional. Additionally, a high melting point material that is difficult to use in vapor deposition can be used in sputtering. The thickness of the mirror layer 7 can also be easily controlled. However, forming the mirror layer 7 by vapor deposition enables about 20 wafers to be processed at one time, so that the manufacturing efficiency can be improved. As described above, in the case in which sputtering is used, the amount of warp of the mirror layer 7 tends to increase due to argon atom trapping during film-forming, and the amount of warp changes significantly due to the release of trapped argon into the atmosphere in the heating step. Even in this case, the method for manufacturing the mirror device 1 according to the embodiment is capable of effectively suppressing the change in the amount of warp of the mirror layer 7 during use of the mirror device 1.

The mirror device 1 includes the first drive coil 11 and the second drive coil 12 for exerting a driving force on the movable mirror portion 10. Although heat tends to be generated during use of the mirror device 1 in this case, in the method for manufacturing the mirror device 1 according to the embodiment, the change in the amount of warp of the mirror layer 7 can be suppressed during use of the mirror device 1 even in this case.

The SOI wafer 80 is heated to 60° C. or higher and 300° C. or lower in the heating step. This enables the residual stress present in the mirror layer 7 to be effectively relieved.

The maximum width of the mirror layer 7 is 0.5 mm or more and 30 mm or less. Although the amount of warp of the mirror layer 7 tends to change during use of the mirror device 1 in this case, in the method for manufacturing the mirror device 1 according to the embodiment, the change in the amount of warp of the mirror layer 7 can be suppressed during use of the mirror device 1 even in this case.

The mirror layer 7 includes the adhesive layer 71, the diffusion prevention layer 72, and the reflective layer 73 formed in this order on the first movable portion 3. The mirror layer 7 can thus be stably formed on the first movable portion 3 by including the adhesive layer 71. The occurrence of metal diffusion between the reflective layer 73 and the adhesive layer 71 during heating can also be suppressed by including the diffusion prevention layer 72.

The mirror layer 7 includes the adhesive layer 71 and the diffusion prevention layer 72 in which a compressive stress remains at the completion of the second forming step, and the reflective layer 73 in which a tensile stress remains at the completion of the second forming step. This enables the amount of warp of the mirror layer 7 prior to the heating step to be reduced. The change in the amount of warp of the mirror layer 7 in the heating step can also be reduced, and as a result, the heating time can be shortened and the amount of warp of the mirror layer 7 can be easily controlled.

The entire SOI wafer 80 is heated in the heating step. This enables uniformity of the temperature of the mirror layer 7 among the plurality of parts S to be achieved during heating.

Modification Example

FIGS. 9(a) and 9(b) are diagrams to describe the method for manufacturing the mirror device 1 according to a modification example. In this modification example, the mirror layer 7 is concavely curved prior to the heating step as illustrated in FIG. 9(a). The amount of warp of the mirror layer 7 increases by heating the SOI wafer 80 in the heating step as illustrated in FIG. 9(b).

Figure 10:
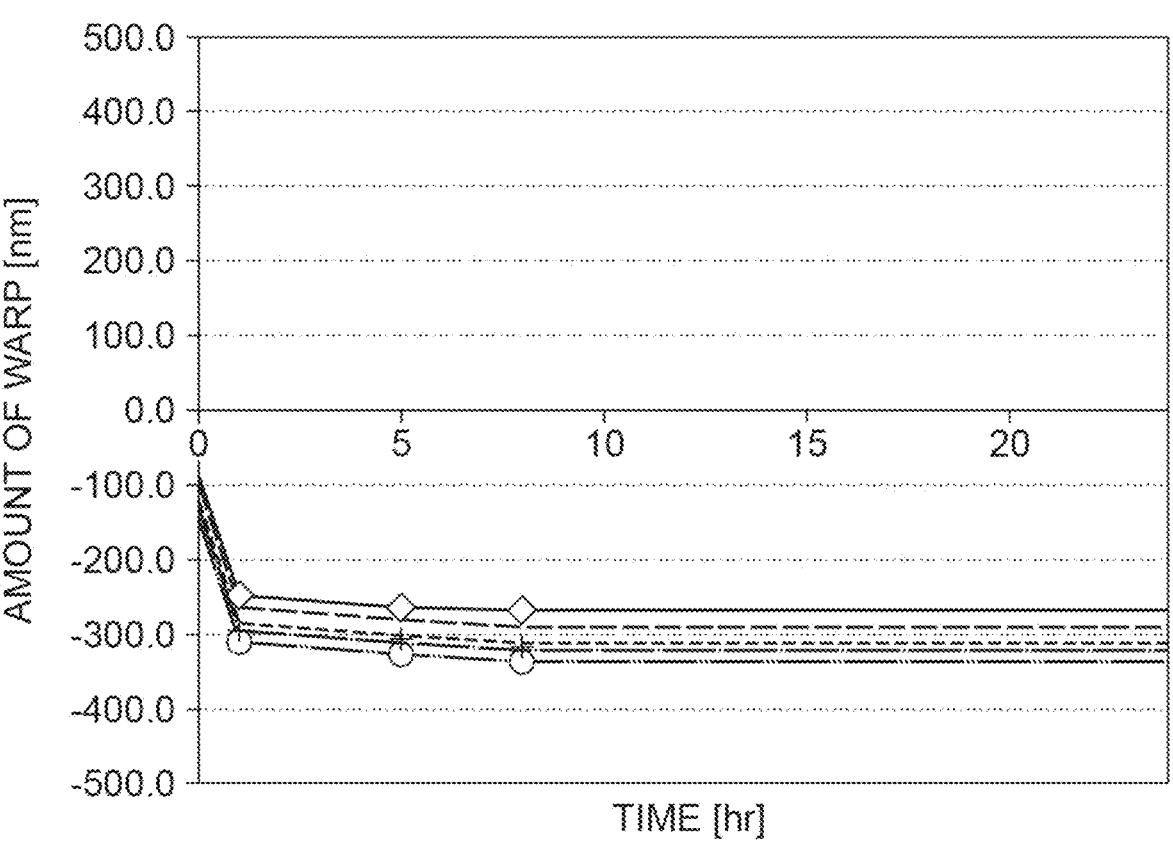
FIG. 10 A graph illustrating examples of the change in the amount of warp of the mirror layer in the heating step of the modification example.

FIG. 10 is a graph illustrating examples of the change in the amount of warp of the mirror layer 7 in the heating step of the modification example. In these examples, the SOI wafer 80 is heated at 150° C. for 30 hours. FIG. 10 illustrates the change in the amount of warp of five samples in different line types. As illustrated in FIG. 10, it can be seen that in all the samples, the amount of warp at the start of heating is about 100 nm, which increases to about 250 to 350 nm by the heating step, and the change in the amount of warp is reduced over time. In the case of FIG. 10, the change in the amount of warp reaches saturation in about two hours, so that the heating time is two hours or longer. Setting the heating time to about the time it takes for the change in the amount of warp to reach saturation enables energy for heating to be reduced.

Figure 11:
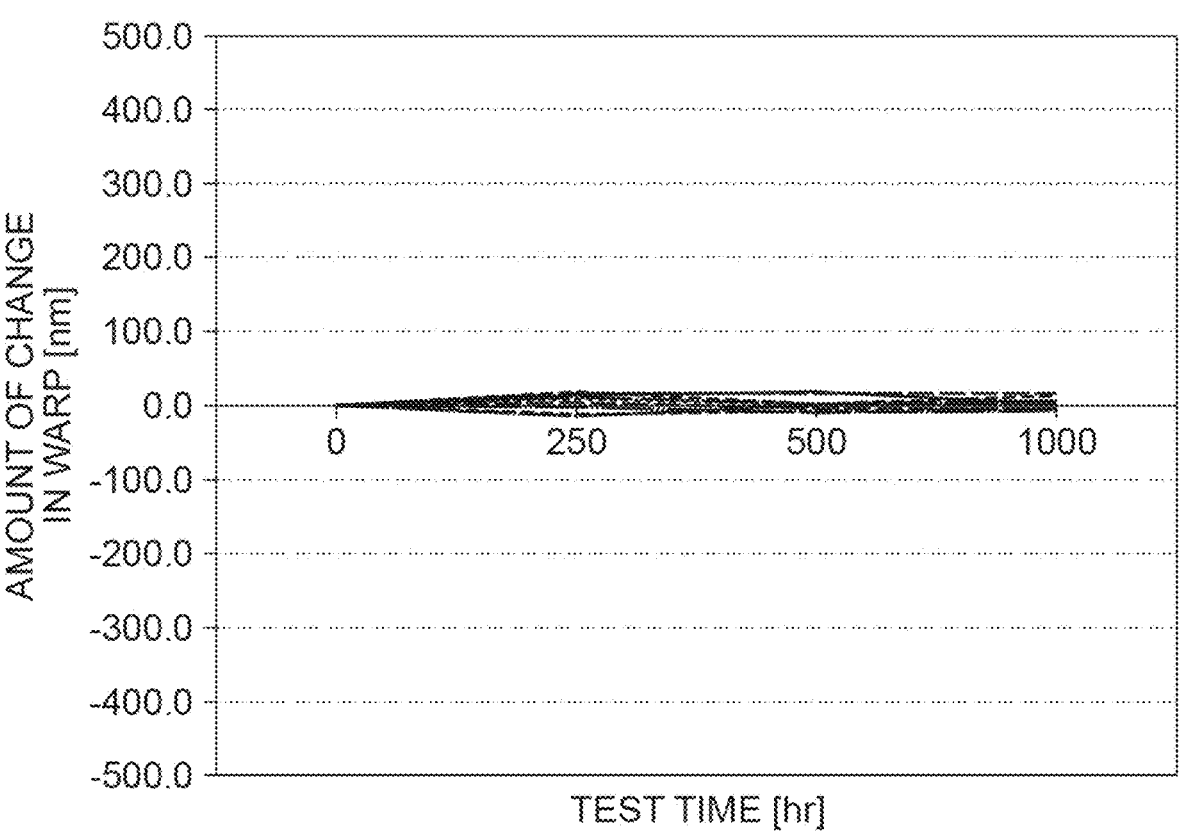
FIG. 11 A graph illustrating examples of the change in the amount of warp of the mirror layer in a reliability test.

FIG. 11 is a graph illustrating examples of the change in the amount of warp of the mirror layer 7 in a reliability test. In this reliability test, the mirror device 1 obtained by the method for manufacturing the mirror device 1 according to the modification example was operated, and the amount of warp of the mirror layer 7 was measured during operation. Specifically, the change in the amount of warp of the mirror layer 7 was measured every 250 hours up to 1000 hours, with the amount of warp of the mirror layer 7 in an initial state (0 hours) being 0 nm. The first movable portion 3 was continuously operated at an optical deflection angle of 10° about the first axis X1, and at an optical deflection angle of 10° about the second axis X2. As illustrated in FIG. 11, it can be seen that the change in the amount of warp of the mirror layer 7 during operation is suppressed to ±50 nm or less.

The present disclosure is not limited to the embodiments above. For example, the material and shape of each configuration are not limited to the materials and shapes described above, and various materials and shapes can be employed. Although the mirror device 1 in the embodiments above is electromagnetically driven, the mirror device 1 may be piezoelectrically driven or electrostatically driven. In the case in which mirror device 1 is piezoelectrically driven, a piezoelectric film (piezoelectric element) may be provided instead of the first drive coil 11 and the second drive coil 12.

The first drive coil 11 may be provided in the second movable portion 4. Even in this case, the first movable portion 3 is capable of swinging at a resonant frequency about the first axis X1. Specifically, when a drive current at a frequency equivalent to the resonant frequency of the first movable portion 3 about the first axis X1 is input to the first drive coil 11, the second movable portion 4 oscillates slightly at that frequency about the first axis X1. This oscillation is transmitted to the first movable portion 3 through the first coupling portions 5 and enables the first movable portion 3 to swing about the first axis X1 at that frequency. In the case in which the first drive coil 11 or a piezoelectric element is provided in the first movable portion 3, although heat is easily transmitted to the mirror layer 7 since the heat source is close to the mirror layer 7, in the method for manufacturing the mirror device 1 described above, the change in the amount of warp of the mirror layer 7 can be suppressed during use of the mirror device 1 even in this case.

The second forming step may be performed prior to the first forming step. For example, the mirror layer 7 may be formed on the part of the SOI wafer 80, corresponding to the first movable portion 3, after the wiring forming step described above has been performed, and the structural body forming step may be performed thereafter. The measuring step may be omitted. The first coupling portions 5 may couple the first movable portion 3 to the support portion 2 such that the first movable portion 3 is movable along a predetermined direction. For example, the first movable portion 3 may be movable along the optical axis direction A (direction perpendicular to the mirror layer 7).

The mirror layer 7 need not include the adhesive layer 71. For example, the adhesive layer 71 may be omitted if the mirror device 1 does not get hot during operation. The mirror layer 7 need not include the diffusion prevention layer 72. For example, the diffusion prevention layer 72 may be omitted if high reflectivity is not required of the mirror layer 7 or if the quality of the appearance of the mirror layer 7 is irrelevant. Omitting at least one of the adhesive layer 71 and the diffusion prevention layer 72 enables the mirror layer 7 to be thinner, and as a result, the amount of warp of the mirror layer 7 prior to the heating step can be reduced, and the change in the amount of warp of the mirror layer 7 can be reduced in the heating step.

Although the entire SOI wafer 80 is heated using a thermostatic chamber in the heating step of the embodiments above, the heating means is not limited as long as the part of each of the plurality of parts S, corresponding to the first movable portion 3, is heated. For example, only the parts of the plurality of parts S, corresponding to the first movable portion 3, may be simultaneously heated by irradiating them with spots of laser light or the like without heating the entire SOI wafer 80. Even in this case, the parts of the plurality of parts S, corresponding to the first movable portion 3, can be uniformly heated by heat being conducted in the SOI wafer 80. Uniform heating can also be achieved even if there is a modification example in the output of the emitted laser light. Heating is performed using a heat source positioned outside the mirror device 1 in the heating step, and not by self-heating caused by the mirror device 1 being driven.

REFERENCE SIGNS LIST

1 . . . Mirror device, 2 . . . Support portion, 3 . . . First movable portion, 4 . . . Second movable portion, 5 . . . First coupling portion, 6 . . . Second coupling portion, 7 . . . Mirror layer, 11 . . . First drive coil, 12 . . . Second drive coil, 50 . . . Structural body, 80 . . . SOI wafer, S . . . Part.

The invention claimed is:

1. A method for manufacturing a mirror device including a structural body that includes a support portion, a movable portion, and a coupling portion coupling the movable portion to the support portion such that the movable portion is swingable or movable, and a mirror layer provided on the movable portion, the method comprising:

a first forming step of forming a plurality of parts on a wafer, each of the plurality of parts corresponding to the structural body;

a second forming step of forming the mirror layer on a part of each of the plurality of parts, the part corresponding to the movable portion;

a heating step of heating the part of each of the plurality of parts corresponding to the movable portion, after the first forming step and the second forming step; and a cutting step of cutting the wafer to separate the plurality of parts from one another, after the heating step, wherein in the heating step, the heating is performed in a state where the movable portion is swingable or movable relative to the support portion.

2. The method for manufacturing a mirror device according to claim 1, further comprising, between the heating step and the cutting step, a measuring step of measuring an amount of warp of the mirror layer.

3. The method for manufacturing a mirror device according to claim 1, wherein in the cutting step, the wafer is cut by forming a modified region inside the wafer by irradiation of laser light, and extending cracks in a thickness direction of the wafer from the modified region.

4. The method for manufacturing a mirror device according to claim 1, wherein the second forming step is performed after the first forming step.

5. The method for manufacturing a mirror device according to claim 1, wherein in the heating step, the amount of warp of the mirror layer is reduced by heating the part of each of the plurality of parts corresponding to the movable portion.

6. The method for manufacturing a mirror device according to claim 1, wherein in the heating step, the amount of warp of the mirror layer is increased by heating the part of each of the plurality of parts corresponding to the movable portion.

7. The method for manufacturing a mirror device according to claim 1, wherein the mirror layer is formed by sputtering in the second forming step.

8. The method for manufacturing a mirror device according to claim 1, wherein the mirror device further includes a coil or a piezoelectric element configured to exert a driving force on the movable portion.

9. The method for manufacturing a mirror device according to claim 1, wherein in the heating step, the part of each of the plurality of parts corresponding to the movable portion is heated to 60° C. or higher and 300° C. or lower.

10. The method for manufacturing a mirror device according to claim 1, wherein a maximum width of the mirror layer is 0.5 mm or more and 30 mm or less.

11. The method for manufacturing a mirror device according to claim 1, wherein the mirror layer includes an adhesive layer, a diffusion prevention layer, and a reflective layer formed in this order on the movable portion.

12. The method for manufacturing a mirror device according to claim 1, wherein the mirror layer includes a plurality of layers including a reflective layer, and the plurality of layers include a layer in which a compressive stress remains at the completion of the second forming step, and a layer in which a tensile stress remains at the completion of the second forming step.

13. The method for manufacturing a mirror device according to claim 1, wherein the entire wafer is heated in the heating step.

14. The method for manufacturing a mirror device according to claim 13, wherein a plurality of the wafers are disposed along a vertical direction in a thermostatic chamber.

15. The method for manufacturing a mirror device according to claim 1, wherein in the heating step, the part of each of the plurality of parts corresponding to the movable portion is heated without heating the entire wafer.

* * * * *